US008617656B2

(12) United States Patent
Nakamori et al.

(10) Patent No.: US 8,617,656 B2
(45) Date of Patent: Dec. 31, 2013

(54) LIQUID PROCESSING APPARATUS, LIQUID PROCESSING METHOD, AND STORAGE MEDIUM

(75) Inventors: Mitsunori Nakamori, Nirasaki (JP); Akira Fujita, Nirasaki (JP); Takayuki Toshima, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 629 days.

(21) Appl. No.: 12/784,744

(22) Filed: May 21, 2010

(65) Prior Publication Data
US 2010/0330283 A1 Dec. 30, 2010

(30) Foreign Application Priority Data

Jun. 26, 2009 (JP) ................................. 2009-152444

(51) Int. Cl.
*B05D 3/10* (2006.01)
*B05D 3/12* (2006.01)

(52) U.S. Cl.
USPC ........... 427/337; 134/26; 427/97.4; 427/99.2; 427/258; 427/343; 427/404

(58) Field of Classification Search
USPC ........... 427/97.3, 97.4, 97.5, 97.6, 97.8, 98.2, 427/98.6, 99.2, 123, 258, 259, 299, 304, 427/333, 337, 340, 343, 404; 134/26
See application file for complete search history.

(56) References Cited

U.S. PATENT DOCUMENTS

| | | | |
|---|---|---|---|
| 6,645,702 B1 | 11/2003 | Rangarajan et al. | |
| 7,699,939 B2 | 4/2010 | Nanba | |
| 2002/0012748 A1* | 1/2002 | Hasegawa | 427/256 |
| 2004/0072108 A1 | 4/2004 | Hyon | |
| 2006/0201363 A1* | 9/2006 | Nakatsukasa et al. | 101/483 |
| 2007/0137677 A1 | 6/2007 | Nanba | |
| 2007/0158751 A1* | 7/2007 | Yun | 257/368 |
| 2008/0008973 A1* | 1/2008 | Goto et al. | 430/432 |
| 2008/0241489 A1 | 10/2008 | Ishibashi et al. | |
| 2010/0075504 A1* | 3/2010 | Tomita et al. | 438/706 |

FOREIGN PATENT DOCUMENTS

| | | |
|---|---|---|
| JP | 03-209715 A1 | 9/1991 |
| JP | 07-142349 A1 | 6/1995 |
| JP | 07-273083 A1 | 10/1995 |
| JP | 08-008163 A1 | 1/1996 |

(Continued)

OTHER PUBLICATIONS

Japanese Office Action dated Nov. 30, 2012.

(Continued)

*Primary Examiner* — Alexander Weddle
(74) *Attorney, Agent, or Firm* — Burr & Brown, PLLC

(57) ABSTRACT

A liquid processing apparatus processes an object to be processed W including a body part $W_i$ and a plurality of projecting-shape parts $W_m$ disposed on the body part $W_i$, with an inorganic film and a different film being laminated to each other. The liquid processing apparatus comprises: a support part 50 configured to support the body part $W_i$; a hydrophobic-liquid supply mechanism 30 configured to supply a hydrophobic liquid to the object to be processed W; and a rinse-liquid supply part 22 configured to supply a rinse liquid to the object to be processed W to which the hydrophobic liquid has been supplied. The hydrophobic-liquid supply mechanism 30 includes: a first hydrophobic-liquid supply part 32 configured to supply a first hydrophobic liquid for making hydrophobic the inorganic film; and a second hydrophobic-liquid supply part 37 configured to supply a second hydrophobic liquid for making hydrophobic the different film.

5 Claims, 7 Drawing Sheets

(56) References Cited

FOREIGN PATENT DOCUMENTS

| | | |
|---|---|---|
| JP | 2002-155268 A1 | 5/2002 |
| JP | 2003-178946 A1 | 6/2003 |
| JP | 2008-016780 A1 | 1/2008 |
| JP | 2008-277748 A1 | 11/2008 |
| TW | 200738358 A | 10/2007 |

OTHER PUBLICATIONS

Taiwanese Search Report dated May 31, 2013.

* cited by examiner

LIQUID PROCESSING APPARATUS, LIQUID PROCESSING METHOD, AND STORAGE MEDIUM

CROSS REFERENCE TO RELATED APPLICATIONS

This application is based upon and claims the benefit of priority from the prior Japanese Patent Application No. 2009-152444 filed on Jun. 26, 2009, the entire contents of which are incorporated herein by reference.

FIELD OF THE INVENTION

The present invention relates to a liquid processing apparatus, a liquid processing method, and a storage medium, which are configured to process an object to be processed including a body part and a plurality of projecting-shape parts disposed on the body part.

BACKGROUND OF THE INVENTION

There has been conventionally known a liquid processing method for processing a semiconductor substrate (object to be processed) including a plurality of minute projecting ridges (projecting-shape parts) which are formed as a minute pattern on a front surface of a substrate body part (body part), the liquid processing method comprising a step in which the semiconductor substrate is subjected to a rinse liquid such as deionized water, and a step in which the semiconductor wafer is dried after the semiconductor substrate has been subjected to the rinse liquid. However, in a case where such a liquid processing method is used, when the rinse liquid having been supplied to the semiconductor substrate is dried, a surface tension of the rinse liquid may act between the projecting ridges formed on the substrate body part, so that the projecting ridges adjacent to each other may be pulled to each other and fall down.

In order to prevent the falling down of the projecting ridges, there is proposed, before the rinse liquid is supplied to the semiconductor substrate, to perform a hydrophobic step in which a hydrophobic liquid is supplied to the projecting ridges as the minute pattern (see, for example, JP7-273083A).

However, even the supply of the hydrophobic liquid can merely restrain a surface tension acting between the projecting ridges (projecting-shape parts) made of semiconductors. When processing an object to be processed, in which an inorganic film and a different film (a metal film, an organic film, or the like), which is different from the inorganic film in properties, are laminated to each other, a surface tension acting between the different films and a surface tension acting between the inorganic film and the different film cannot be restrained.

DISCLOSURE OF THE INVENTION

This disclosure provides a liquid processing apparatus, a liquid processing method, and a storage medium, which are capable of preventing the projecting-shape part from falling down, even when processing an object to be processed, in which an inorganic film and a different film (a metal film, an organic film, or the like), which is different from the inorganic film in properties, are laminated to each other.

The liquid processing apparatus according to this disclosure is the liquid processing apparatus configured to process an object to be processed including a body part and a plurality of projecting-shape parts disposed on the body part, with an inorganic film and a different film, which is different from the inorganic film in properties, being laminated to each other, the liquid processing apparatus comprising:

a support part configured to support the body part of the object to be processed;

a hydrophobic-liquid supply mechanism configured to supply a hydrophobic liquid to the object to be processed supported by the support part; and a rinse-liquid supply part configured to supply a rinse liquid to the object to be processed to which the hydrophobic liquid has been supplied by the hydrophobic-liquid supply mechanism;

wherein the hydrophobic-liquid supply mechanism has: a first hydrophobic-liquid supply part configured to supply, to the object to be processed, a first hydrophobic liquid for making hydrophobic the inorganic film; and a second hydrophobic-liquid supply part configured to supply, to the object to be processed, a second hydrophobic liquid for making hydrophobic the different film.

The liquid processing method according to this disclosure is the liquid processing method configured to process an object to be processed including a body part and a plurality of projecting-shape parts disposed on the body part, with an inorganic film and a different film, which is different from the inorganic film in properties, being laminated to each other, the liquid processing method comprising:

supporting the body part of the object to be processed by a support part;

supplying a first hydrophobic liquid for making hydrophobic the inorganic film, to the object to be processed supported by the support part;

supplying a second hydrophobic liquid for making hydrophobic the different film, to the object to be processed supported by the support part; and supplying a rinse liquid to the object to be processes to which the first hydrophobic liquid and the second hydrophobic liquid have been supplied.

The storage medium according to this disclosure is the storage medium storing a computer program executable by a liquid processing apparatus to perform a liquid processing method comprising:

supporting the body part of the object to be processed by a support part;

supplying a first hydrophobic liquid for making hydrophobic the inorganic film, to the object to be processed supported by the support part;

supplying a second hydrophobic liquid for making hydrophobic the different film, to the object to be processed supported by the support part; and supplying a rinse liquid to the object to be processes to which the first hydrophobic liquid and the second hydrophobic liquid have been supplied.

According to this disclosure, the inorganic film is made hydrophobic by the first hydrophobic liquid, and the different film is made hydrophobic by the second hydrophobic liquid. Thus, even when processing an object to be processed, in which an inorganic film and a different film (a metal film, an organic film, or the like), which is different from the inorganic film in properties, are laminated to each other, the projecting-shape part can be prevented from falling down.

DETAILED DESCRIPTION OF THE INVENTION

Embodiment

An embodiment of the liquid processing apparatus and the liquid processing method according to this, disclosure will be described herebelow with reference to the drawings. FIGS. 1 to 8 show the embodiment according to the present invention.

Figure 3:
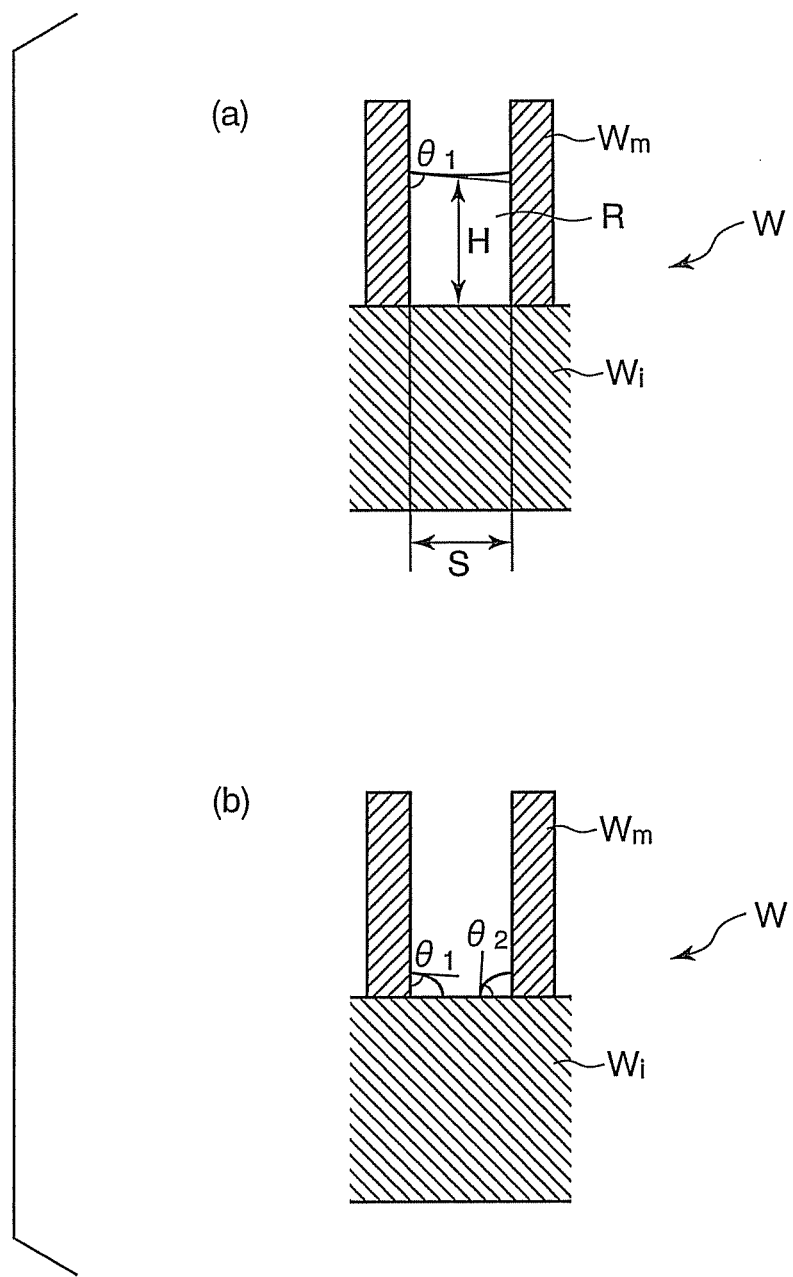
FIG. 3 is a side sectional view for explaining an effect of a liquid processing method in one embodiment according to the present invention.

The liquid processing apparatus in this embodiment is used for processing a substrate to be processed (object to be processed) W including a substrate body part (body part) $W_i$ formed of an inorganic film, and a plurality of projecting-shape parts $W_m$ disposed on the substrate body part $W_i$ (see, FIG. 3). The projecting-shape parts $W_m$ are formed of a different film (a metal film in this embodiment) different from the inorganic film in properties. The substrate body part $W_i$ formed of the inorganic film and the projecting-shape parts $W_m$ formed of the metal film are laminated to each other. The projecting-shape parts $W_m$ are formed on the substrate body part $W_i$ as a predetermined pattern.

As a material of the inorganic film constituting the substrate body part $W_i$, Si, $SiO_2$, or SiN may be used, for example, but the material is not limited thereto. As a material of the metal film constituting the projecting-shape part $W_m$, TiN (titanium nitride), W (tungsten), or Hf (hafnium) may be used, for example, but the material is not limited thereto. In addition, as such a substrate to be processed W, a semiconductor substrate such as a semiconductor wafer may be used, for example.

Figure 1:
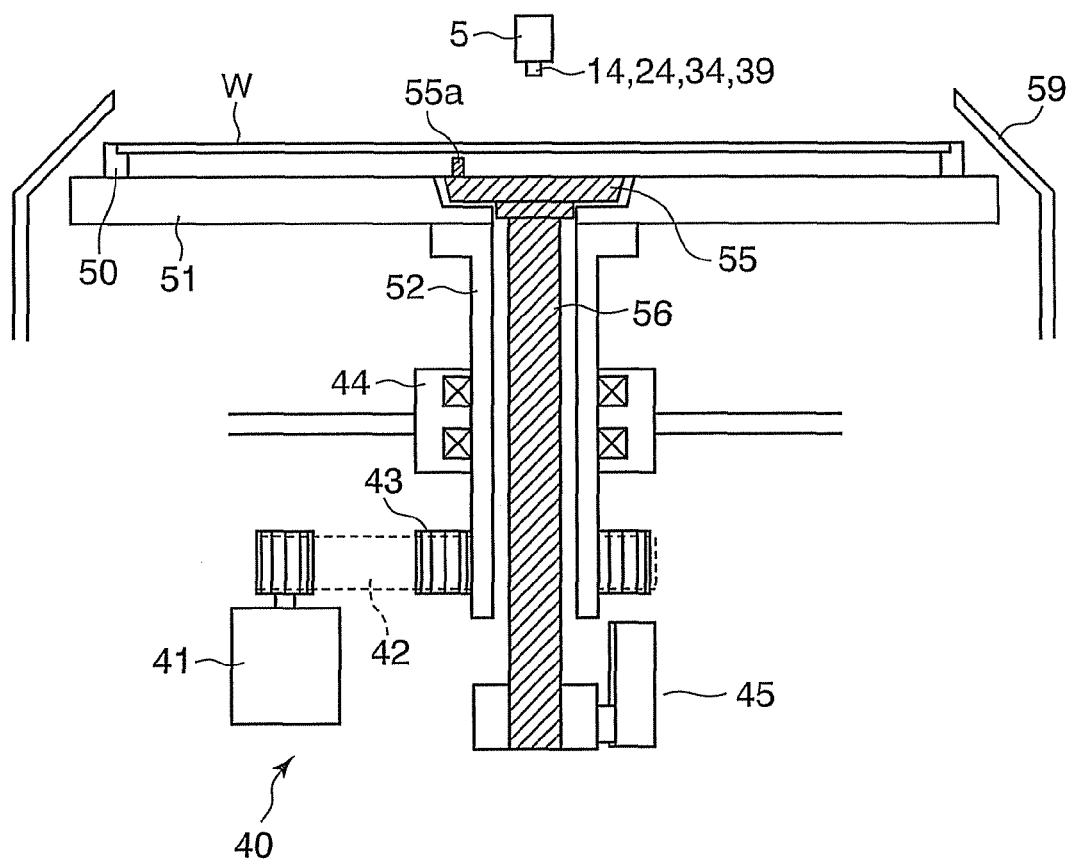
FIG. 1 is a side sectional view showing a structure of a liquid processing apparatus in one embodiment according to the present invention.
Figure 1:
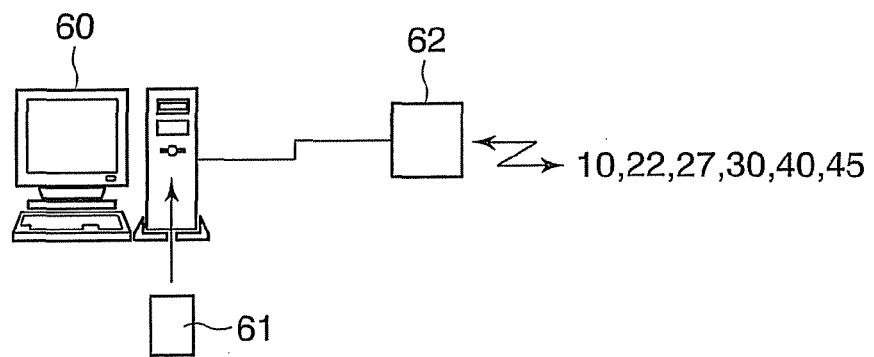

As shown in FIG. 1, the liquid processing apparatus includes: a support plate 51 of a hollow structure, having a support part 50 configured to hold and support the substrate body part $W_i$ of the substrate to be processed W; a rotary shaft 52 of a hollow structure, the rotary shaft 52 being joined to a lower surface of the support plate 51 and extended in an up and down direction; a lift pin plate 55 disposed in the hollow space of the support plate 51, the lift pin plate 55 having a lift pin 55a capable of being brought into contact with a rear surface (lower surface) of the substrate to be processed W; a lift shaft 56 joined to a lower surface of the lift pin plate 55 and extended in the hollow space of the rotary shaft 52 in the up and down direction; and a lift drive part 45 configured to move the lift shaft 56 in the up and down direction. On an outer peripheral part of the support plate 51, there is provided a cup 59 configured to cover a periphery and a diagonally upper portion of the substrate to be processed W supported by the support part 50. In FIG. 1, although only the one lift pin 55a is illustrated, the three lift pins 55a are actually disposed on the lift pin plate 55 in this embodiment.

As shown in FIG. 1, the liquid processing apparatus further includes a rotary drive mechanism 40 having a pulley 43 disposed on an outer peripheral part of the rotary shaft 52, and a motor 41 configured to impart a driving force to the pulley 43 through a drive belt 42. The rotary drive mechanism 40 is configured to rotate the support part 50 about the rotary shaft 52 which is rotated by the motor 41, whereby the substrate to be processed W held and supported by the support part 50 is rotated. A bearing 44 is disposed on an outer peripheral part of the rotary shaft 52.

Figure 2:
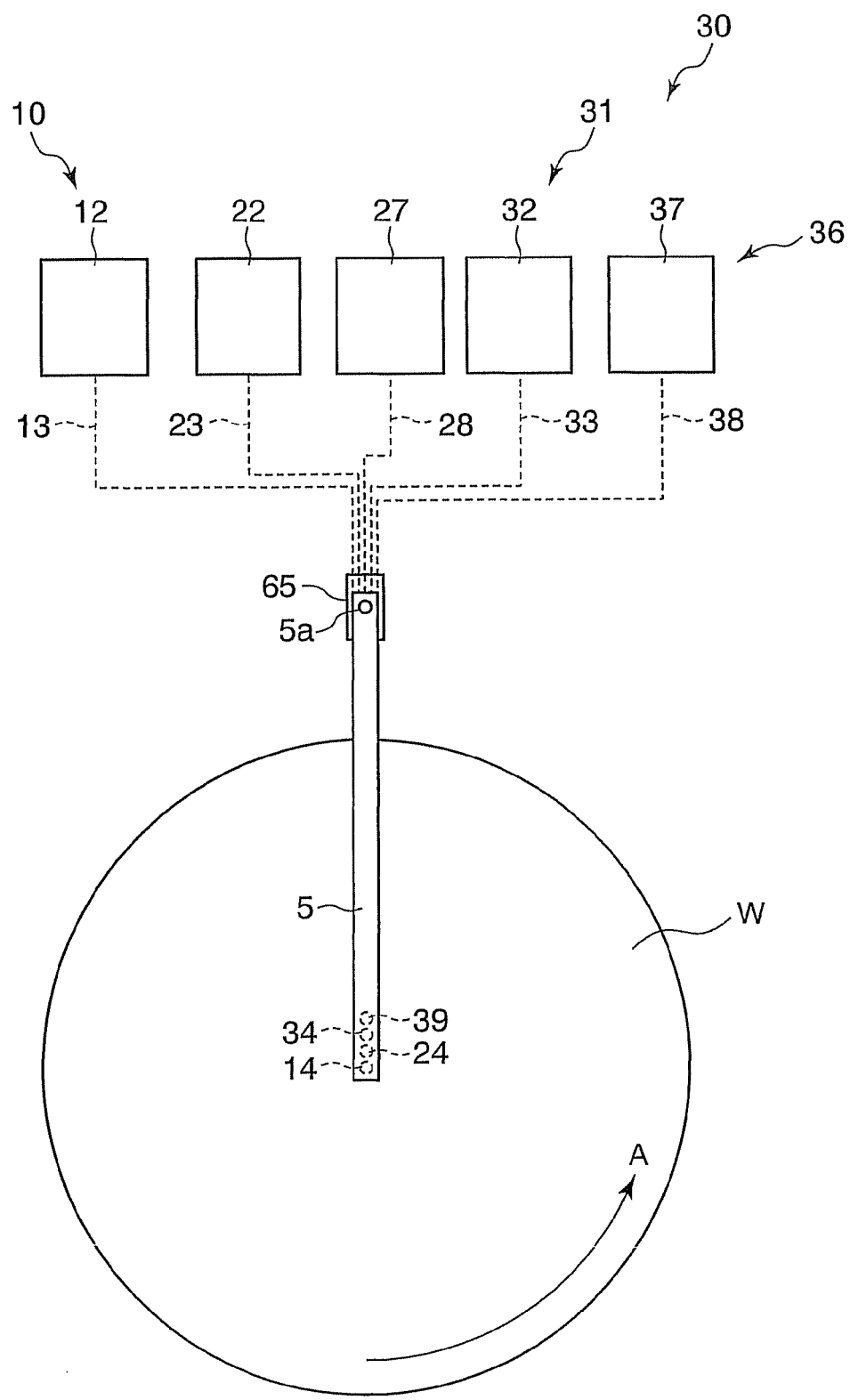
FIG. 2 is a top plan view showing the structure of the liquid processing apparatus in one embodiment according to the present invention.

As shown in FIG. 2, the liquid processing apparatus further includes: a chemical-liquid supply mechanism 10 configured to supply a chemical liquid to the substrate to be processed W supported by the support part 50; a hydrophobic-liquid supply mechanism 30 configured to supply a hydrophobic liquid to the substrate to be processed W; a rinse-liquid supply part 22 configured to supply a rinse liquid to the substrate to be processed W; and a substitute-liquid supply part 27 configured to supply a substitute liquid to the substrate to be processed W.

The chemical-liquid supply mechanism 10 includes: a chemical-liquid supply part 12 configured to supply a chemical liquid; a chemical-liquid supply pipe 13 configured to guide the chemical liquid supplied from the chemical-liquid supply part 12; a liquid supply arm 5 through which a part of the chemical-liquid supply pipe 13 passes; and a liquid supply nozzle 14 disposed on an end of the liquid supply arm 5. As the chemical liquid used in this embodiment, sulfuric acid/hydrogen peroxide mixture, ammonia hydrogen peroxide mixture, or dilute hydrofluoric acid may be used, for example, but the chemical liquid is not limited thereto.

As shown in FIG. 2, joined to the rinse-liquid supply part 22 is a rinse-liquid supply pipe 23 configured to guide a rinse liquid supplied from the rinse-liquid supply part 22. The liquid supply nozzle 14 is connected to an end of the rinse-liquid supply pipe 23. In addition, joined to the substitute-liquid supply part 27 is a substitute-liquid supply pipe 28 configured to guide a substitute liquid supplied from the substitute-liquid supply part 27. A substitute-liquid supply nozzle 24 is joined to an end of the substitute-liquid supply pipe 28. A part of the rinse-liquid supply pipe 23 and a part of the substitute-liquid supply pipe 28 pass through the liquid supply arm 5. As the rinse liquid used in this embodiment, a deionized water (DIW) may be used, for example, but the rinse liquid is not limited thereto. As the substitute liquid, an amphipathic liquid such as IPA (isopropyl alcohol) may be used, for example, but the substitute liquid is not limited thereto.

As shown in FIG. 2, the hydrophobic-liquid supply mechanism 30 includes a first hydrophobic-liquid supply mechanism 31 configured to supply, to the substrate to be processed W, a first hydrophobic liquid for making hydrophobic the substrate body part $W_i$ which is formed of the inorganic film. The first hydrophobic-liquid supply mechanism 31 has: a first hydrophobic-liquid supply part 32 configured to supply the first hydrophobic liquid; a first hydrophobic liquid supply pipe 33 configured to guide the first hydrophobic liquid supplied from the first hydrophobic-liquid supply part 32; the liquid supply arm 5 through which a part of the first hydrophobic liquid supply pipe 33 passes; and a first hydrophobic liquid supply nozzle 34 joined to the first hydrophobic liquid supply pipe 33 and disposed on the end of the liquid supply arm 5. As the first hydrophobic liquid used in this embodiment, a sylilating agent such as dimethyl amino trimethyl silane (TMSDMA), dimethyl (dimethyl amino) silane (DMSDMA), 1, 1, 3, 3-tetramethyl disilane (TMDS), or hexamethyl disilazane (HMDS), and a fluorine polymer chemical liquid may be used, for example, but the first hydrophobic liquid is not limited thereto.

As shown in FIG. 2, the hydrophobic-liquid supply mechanism 30 also includes a second hydrophobic-liquid supply mechanism 36 configured to supply, to the substrate to be processed W, a second hydrophobic liquid for making hydrophobic the projecting-shape parts $W_m$ which are formed of the metal film (different film). The second hydrophobic-liquid supply mechanism 36 has: a second hydrophobic-liquid supply part 37 configured to supply the second hydrophobic liquid; a second hydrophobic liquid supply pipe 38 configured to guide the second hydrophobic liquid supplied from the second hydrophobic-liquid supply part 37; the liquid supply arm 5 through which a part of the second hydrophobic liquid supply pipe 38 passes; and a second hydrophobic liquid supply nozzle 39 joined to the second hydrophobic liquid supply pipe 38 and disposed on the end of the liquid supply arm 5. As the second hydrophobic liquid used in this embodiment, a surface active agent may be used, for example, but the second hydrophobic liquid is not limited thereto.

As show in FIG. 2, the liquid processing apparatus includes a liquid-supply-arm moving part 65 configured to swing the liquid supply arm 5 in a horizontal direction (a direction perpendicular to the rotary shaft 52) about a swing shaft 5*a*. In addition, as shown in FIG. 1, the liquid processing apparatus includes a control part 62 configured to control the liquid processing apparatus itself.

In this embodiment, a computer program executable by the liquid processing apparatus to perform the below-described liquid processing method is stored in a storage medium 61 (see, FIG. 1). The liquid processing apparatus is further equipped with a computer 60 capable of receiving the storage medium 61. The control part 62 is configured to control the liquid processing apparatus itself (more specifically, the chemical-liquid supply mechanism 10, the rinse-liquid supply part 22, the substitute-liquid supply part 27, the hydrophobic-liquid supply mechanism 30, the rotary drive mechanism 40, and the lift drive part 45), upon reception of a signal from the computer 60. In this patent application, the storage medium 61 means, e.g., a CD, a DVD, an MD, a hard disc, or a RAM.

Next, an operation of this embodiment as structured above will be described.

At first, the lift pin plate 55 is located on an upper position (a position at which a transfer robot (not shown) transfers the substrate to be processed W) by the lift drive part 45 (upper-position locating step). At this time, the liquid supply arm 5 is located on a position apart from a position above the support plate 51.

Then, the substrate to be processed W is received from the transfer robot by the three lift pins 55*a* of the lift pin plate 55, and the rear surface (lower surface) of the substrate to be processed W is supported by the lift pins 55*a* (receiving step).

Then, the lift pin plate 55 is located on a lower position (a position at which the substrate to be processed W is processed by a chemical liquid and so on) by the lift drive part 45 (lower-position locating step) (see, FIG. 1).

While the lift pin plate 55 is located to the lower position, the substrate body part $W_i$ of the substrate to be processed W is held and supported by the support part 50 of the support plate 51 (supporting step) (see, FIG. 1). At this time, the substrate to be processed W is oriented such that the projecting-shape parts $W_m$ are disposed above, and that the substrate body part $W_i$ is disposed below (see, FIGS. 3(*a*) and 3(*b*)). In addition, at this time, the liquid supply arm 5 is moved in the horizontal direction about the swing shaft 5*a* by the liquid-supply-arm moving part 65, so that the liquid supply arm 5 is moved to a position above the substrate to be processed W.

Then, the rotary shaft 52 is rotated by the motor 41, so that the substrate to be processed W held and supported by the support part 50 of the support plate 51 is rotated (rotating step) (see, arrow A in FIG. 2). During the rotation of the substrate to be processed W, the following steps are performed.

Figure 4:
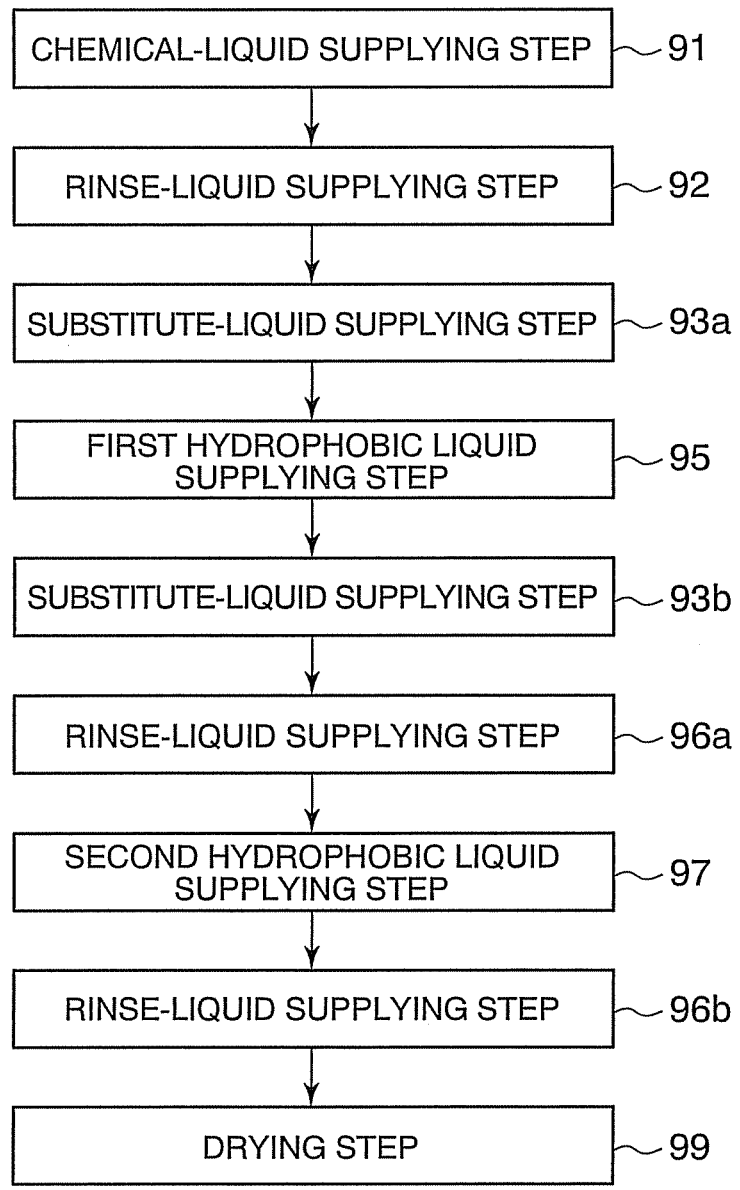
FIG. 4 is a flowchart showing a part of an order of the liquid processing method in one embodiment according to the present invention.

At first, the chemical liquid is supplied to the substrate to be processed W by the chemical-liquid supply mechanism 10 (chemical-liquid supplying step 91) (see, FIGS. 2 and 4).

Then, the rinse liquid is supplied from the rinse-liquid supply part 22 to the surface of the substrate to be processed W to which the chemical liquid has been supplied by the chemical-liquid supply mechanism 10, such that the projecting-shape parts $W_m$ of the substrate to be processed W are not exposed from a liquid surface (rinse-liquid supplying step 92) (see, FIGS. 2 and 4). Since the rinse liquid is supplied to the substrate to be processed W in this manner, a reaction of the chemical liquid on the substrate to be processed W can be stopped.

Then, the substitute liquid for substituting the rinse liquid with the first hydrophobic liquid is supplied from the substitute-liquid supply part 27 to the surface of the substrate to be processed W to which the rinse liquid has been supplied by the rinse-liquid supply part 22, such that the projecting-shape parts $W_m$ of the substrate to be processed W are not exposed from a liquid surface (substitute-liquid supplying step 93*a*) (see, FIGS. 2 and 4).

Then, the first hydrophobic liquid is supplied from the first hydrophobic-liquid supply mechanism 31 of the hydrophobic-liquid supply mechanism 30 to the surface of the substrate to be processed W to which the substitute liquid has been supplied by the substitute-liquid supply part 27, such that the projecting-shape parts $W_m$ of the substrate to be processed W are not exposed from a liquid surface (first hydrophobic liquid supplying step 95) (see, FIGS. 2 and 4). At this time, the first hydrophobic liquid adheres to the surface of the substrate body part $W_i$, which is formed of the inorganic film, therefore the substrate body part $W_i$ is made hydrophobic. In this embodiment, the substitute liquid capable of dissolving the first hydrophobic liquid is supplied, before the first hydrophobic liquid is supplied to the substrate to be processed W. Thus, the substrate body part $W_i$ can be more effectively made hydrophobic.

Then, the substitute liquid for substituting the first hydrophobic liquid with the rinse liquid is supplied from the substitute-liquid supply part 27, such that the projecting-shape parts $W_m$ of the substrate to be processed W are not exposed from a liquid surface (substitute-liquid supplying step 93*b*) (see, FIGS. 2 and 4).

Then, the rinse liquid is supplied from the rinse-liquid supply part 22, such that the projecting-shape parts $W_m$ of the substrate to be processed W are not exposed from a liquid surface (rinse-liquid supplying step 96*a*) (see, FIGS. 2 and 4). Since the rinse liquid is supplied after the substitute liquid has been supplied, the remaining first hydrophobic liquid can be dissolved in the substitute liquid and then washed away by the rinse liquid, without the first hydrophobic liquid adhering to the surface of the substrate body part $W_i$. Thus, the remaining first hydrophobic liquid can be reliably removed.

Then, the second hydrophobic liquid is supplied from the second hydrophobic-liquid supply mechanism 36 of the hydrophobic-liquid supply mechanism 30 to the surface of the substrate to be processed W to which the rinse liquid has been supplied by the rinse-liquid supply part 22, such that the projecting-shape parts $W_m$ of the substrate to be processed W are not exposed from a liquid surface (second hydrophobic liquid supplying step 97) (see, FIGS. 2 and 4). At this time, the second hydrophobic liquid adheres to the surface of the projecting-shape parts $W_m$, which are formed of the metal film (different film), therefore the projecting-shape parts $W_m$ are made hydrophobic.

Then, the rinse liquid is supplied from the rinse-liquid supply part 22, such that the projecting-shape parts $W_m$ of the substrate to be processed W are not exposed from a liquid surface (rinse-liquid supplying step 96b) (see, FIGS. 2 and 4). Since the rinse liquid is supplied after the second hydrophobic liquid has been supplied, the remaining second hydrophobic liquid can be washed away, without the second hydrophobic liquid adhering to the surfaces of the projecting-shape parts $W_m$.

Then, the supply of the rinse liquid from the rinse-liquid supply part 22 is stopped. Thereafter, the rotary speed of the motor 41 is increased so as to dry the substrate to be processed W (drying step 99). As a result, the substrate to be processed W is exposed from the liquid surface of the rinse liquid. However, since the respective projecting-shape parts $W_m$ and the substrate body part $W_i$ have been made hydrophobic with respect to the rinse liquid, a surface tension acting between the projecting-shape parts $W_m$ and a surface tension acting between the projecting-shape part $W_m$ and the substrate body part $W_i$ can be reduced, which prevents the projecting-shape parts $W_m$ from falling down. While the substrate to be processed W is rotated and dried as described above, the liquid, supply arm 5 is moved in the horizontal direction about the swing arm 5a by the liquid-supply-arm moving part 65, so that the liquid supply arm 5 is moved to the position apart from the position above the substrate to be processed W.

Then, the rotation of the motor 41 is stopped, so that the rotation of the substrate to be processed W is stopped (see, FIG. 1). Then, the lift pin plate 55 is located on the upper position by the lift drive part 45, and the substrate to be processed W is brought up by the lift pins 55a (upper-position locating step). After that, the substrate to be processed W is received and unloaded by the transfer robot (unloading step).

As described above, in this embodiment, since the respective chemical-liquid supplying step 91, the rinse-liquid supplying steps 92, 96a, and 96b, the substitute-liquid supplying steps 93a and 93b, the first hydrophobic liquid supplying step 95, and the second hydrophobic liquid supplying step 97 are performed, without the projecting-shape parts $W_m$ being exposed from the liquid surface. Thus, action of a surface tension between the projecting-shape parts $W_m$ can be prevented, until the supply of the rinse liquid is stopped before the drying step 99 is performed.

Moreover, the substrate body part $W_i$, which is formed of the inorganic film, is made hydrophobic by the first hydrophobic liquid, and the projecting-shape parts $W_m$, which are formed of the metal film, are made hydrophobic by the second hydrophobic liquid. Thus, even after the supply of the rinse liquid is stopped, a force F which would fall down the projecting-shape parts $W_m$ can be significantly reduced.

To describe more concretely, the force F, which would fall down the projecting-shape parts $W_m$ when the rinse liquid R is present between the projecting-shape parts $W_m$, is obtained by the following expression (see, FIG. 3(a)).

$$F = \frac{2\gamma\cos\theta}{S}HD$$

in which $\gamma$ represents an interfacial tension between the rinse liquid R and the projecting-shape part $W_m$, $\theta(\theta_1)$ represents an inclination angle of the rinse liquid R relative to the side surface of the projecting-shape part $W_m$, H represents a liquid surface height of the rinse liquid R between the projecting-shape parts $W_m$, D (not shown) represents a longitudinal length of the projecting-shape part $W_m$, and S represents an interval between the projecting-shape parts $W_m$ (see, FIG. 3(a)). Immediately before the rinse liquid R disappears from between the projecting-shape parts $W_m$ (see, FIG. 3(b)), the force F acts between the projecting-shape part $W_m$ and the substrate body part $W_i$. In this case, the force F, which depends on the inclination angle $\theta_1$ relative to the side surface of the projecting-shape part $W_m$ and the inclination angle $\theta_2$ relative to the front surface of the substrate body part $W_i$, acts between the projecting-shape part $W_m$ and the substrate body part $W_i$.

Figure 9:
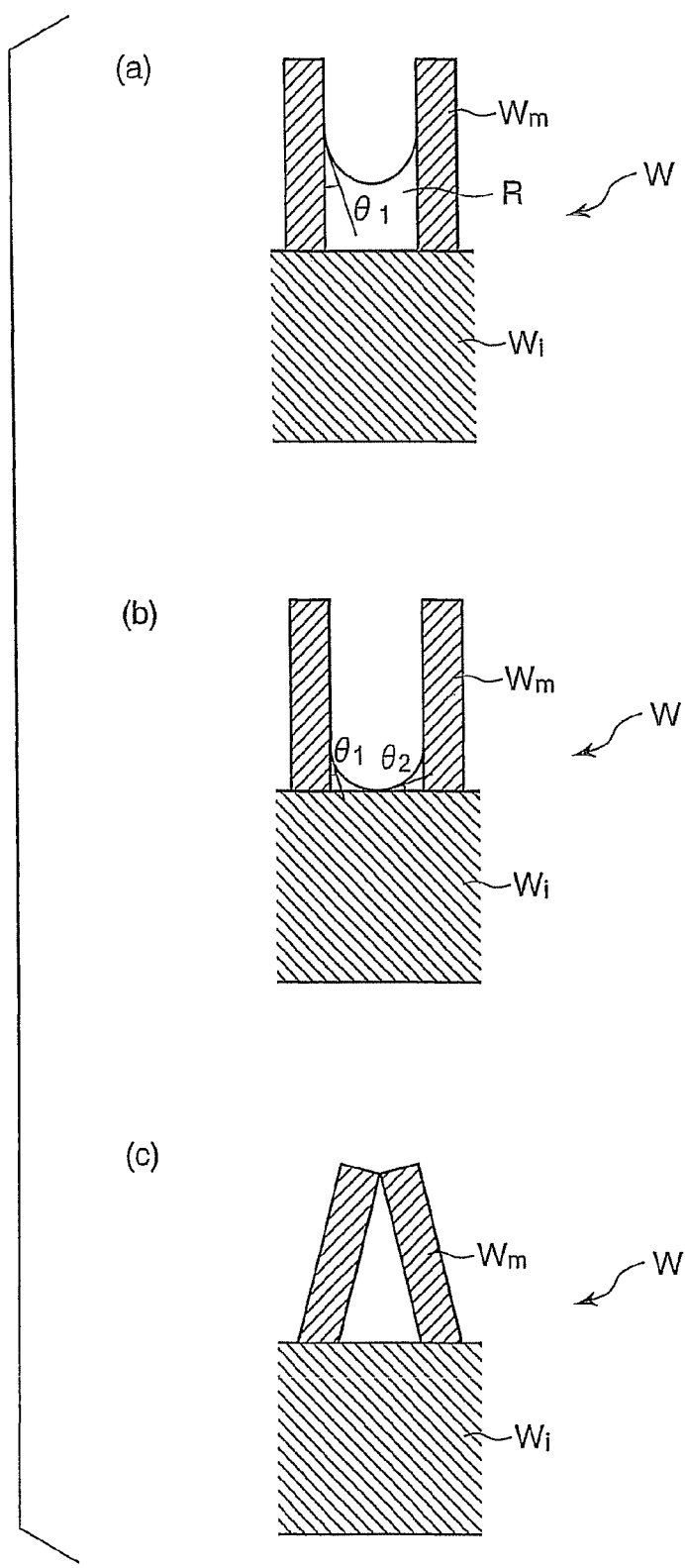
FIG. 9 is a side sectional view showing an example in which a substrate to be processed is processed by a conventional liquid processing method.

As shown in FIGS. 9(a) to 9(c), when the side surface of the projecting-shape part $W_m$ of the substrate to be processed W is not made hydrophobic, since the rinse liquid R is pulled by the projecting-shape part $W_m$, the inclination angle $\theta_1$ is small ($\cos\theta_1$ is large), as shown in FIG. 9(a). As a result, the force F which would fall down the projecting-shape parts $W_m$ is increased, whereby the projecting-shape parts $W_m$ fall down (see, FIG. 9(c)).

On the other hand, in this embodiment, since the projecting-shape parts $W_m$, which are formed of the metal film (different film), are made hydrophobic by the second hydrophobic liquid, the inclination angle $\theta_1$ of the rinse liquid R relative to the side surface of the projecting-shape part $W_m$ can be maintained at about 90°, in the course of drying the substrate to be processed W (see, FIG. 3(a)), whereby the force F can be reduced. Therefore, the projecting-shape parts $W_m$ can be prevented from falling down.

In addition, in this embodiment, since the substrate body part $W_i$, which is formed of the inorganic film, is made hydrophobic by the first hydrophobic liquid, a surface tension acting between the projecting-shape part $W_m$ and the substrate body part $W_i$ can be reduced immediately before the substrate to be processed W is completely dried. That is to say, as shown in FIGS. 9(a) to 9(c), when the substrate body part $W_i$ of the substrate to be processed W is not made hydrophobic, not only the inclination angle $\theta_1$ of the rinse liquid R relative to the side surface of the projecting-shape part $W_m$ but also the inclination angle $\theta_2$ of the rinse liquid R relative to the front surface Ware small (see, FIG. 9(b)), whereby a surface tension acting between the projecting-shape part $W_m$ and the substrate body part $W_i$ is increased. As a result, the force F which would fall down the projecting-shape part $W_m$ fall down is increased, which then invites the falling down of the projecting-shape part $W_m$ (see, FIG. 9(c)). On the other hand, in this embodiment, not only the projecting-shape part $W_m$ but also the substrate body part $W_i$ are made hydrophobic. Thus, not only that the inclination angle $\theta_1$ of the rinse liquid R relative to the side surface of the projecting-shape part $W_m$ can be maintained at about 90°, but also that the inclination angle $\theta_2$ of the rinse liquid R with respect to the front surface of the substrate body part $W_i$ can be maintained at about 90° (see, FIG. 3(b)). Therefore, the force F, which acts between the projecting-shape part $W_m$ and the substrate body part $W_i$ through the rinse liquid R, can be reduced, whereby the projecting-shape parts $W_m$ can be prevented from falling down.

In the description above, the second hydrophobic liquid supplying step 97 is performed after the first hydrophobic liquid supplying step 95. However, not limited thereto, the first hydrophobic liquid supplying step 95 may be performed after the second hydrophobic liquid supplying step 97. More specifically, as shown in FIG. 5, between the chemical-liquid supplying step 91 and the drying step 99, there may be sequentially performed the rinse-liquid supplying step 96a, the second hydrophobic liquid supplying step 97, the rinse-liquid supplying step 96b, the substitute-liquid supplying step 93a, the first hydrophobic liquid supplying step 95, the substitute-liquid supplying step 93b, and the rinse-liquid supplying step 98.

Also in this case, the substrate body part $W_i$, which is formed of the inorganic film, is made hydrophobic by the first hydrophobic liquid, and the projecting-shape parts $W_m$, which are formed of the metal film (different film), are made hydrophobic by the second hydrophobic liquid. Thus, even after the supply of the rinse liquid is stopped, the force F which would fall down the projecting-shape parts $W_m$ can be significantly reduced.

Figure 5:
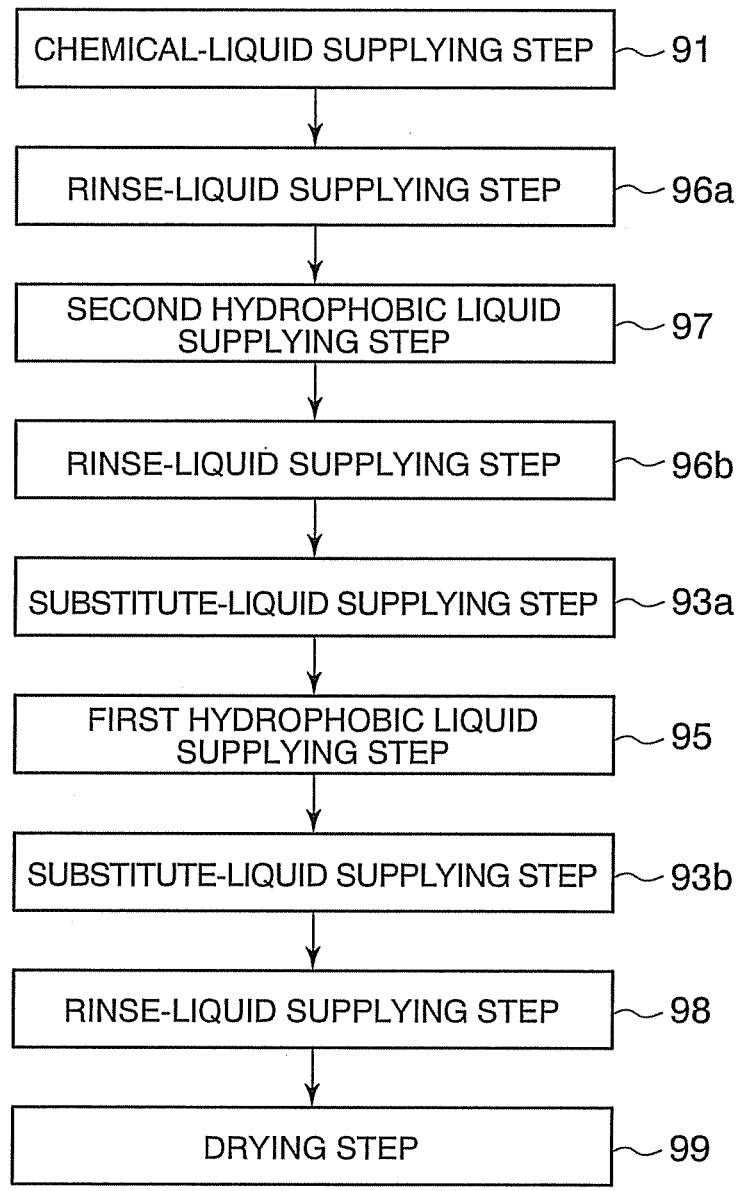
FIG. 5 is a flowchart showing a part of an order of the liquid processing method in a modification of one embodiment according to the present invention.
Figure 6:
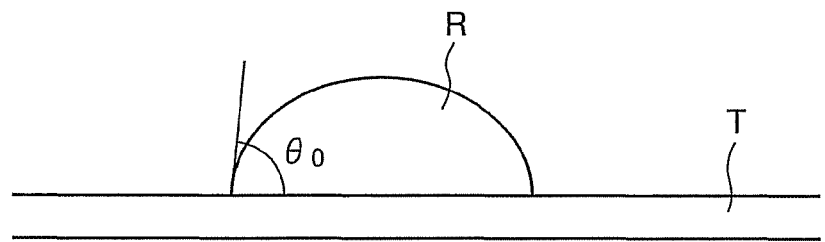
FIG. 6 is a side sectional view for explaining a result of an experiment shown in Table 1.
Figure 7:
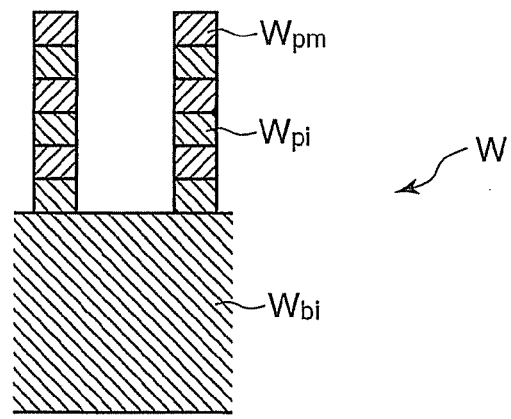
FIG. 7 is a side sectional view showing an alternative example of a substrate to be processed used in one embodiment according to the present invention.

An experiment was performed in which an object to be checked T was not processed at all (unprocessed), an object to be checked T was subjected to only the second hydrophobic liquid supplying step 97, an object to be checked T was subjected to only the first hydrophobic liquid supplying step 95, an object to be checked T was subjected to the second hydrophobic liquid supplying step 97 after the first hydrophobic liquid supplying step 95 (see, FIG. 4), and an object to be checked T was subjected to the first hydrophobic liquid supplying step 95 after the second hydrophobic liquid supplying step 97 (see, FIG. 5). Then, a deionized water (DIW) as the rinse liquid R was placed on the objects to be checked T, and the inclination angles $\theta_0$ of the rinse liquid R relative to the front surfaces of the objects to be checked T were measured (see, FIG. 6). Table 1 shows the result. As the object to be checked T, TiN (titanium nitride) and W (tungsten) capable of being used as the metal film, and $SiO_2$ capable of being used as the inorganic film, were used.

TABLE 1

|  | unprocessed | $2^{nd}$ hydrophobic liquid | $1^{st}$ hydrophobic liquid | $1^{st}$ hydrophobic liquid → $2^{nd}$ hydrophobic liquid | $2^{nd}$ hydrophobic liquid → $1^{st}$ hydrophobic liquid |
|---|---|---|---|---|---|
| TiN | 18.0 | 96.1 | 21.1 | 94.3 | 67.7 |
| W | 28.2 | 100.0 | 18.7 | 91.9 | 77.4 |
| $SiO_2$ | 5.4 | 5.2 | 92.3 | 90.4 | 91.6 |

As can be understood from the above result shown in Table 1, when only the second hydrophobic liquid supplying step 97 was performed, the inclination angle relative to the inorganic film ($SiO_2$) was small. Meanwhile, when only the first hydrophobic liquid supplying step 95 was performed, the inclination angle relative to the metal film (TiN and W) was small.

On the other hand, when the first hydrophobic liquid supplying step 95 was performed after the second hydrophobic liquid supplying step 97, not only the inclination angle $\theta_0$ relative to the inorganic film ($SiO_2$) was almost near to 90°, but also the inclination angle $\theta_0$ relative to the metal film (TiN and W) was large to a some degree. Namely, an excellent effect was provided. Moreover, when the second hydrophobic liquid supplying step 97 was performed after the first hydrophobic liquid supplying step 95, not only the inclination angle $\theta_0$ relative to the inorganic film ($SiO_2$) was almost near to 90°, but also the inclination angle $\theta_0$ relative to the metal film (TiN and W) was almost near to 90°. Namely, a further excellent effect was provided.

As can be understood from the result shown in Table 1, a more excellent effect is provided when the second hydrophobic liquid supplying step 97 is performed after the first hydrophobic liquid supplying step 95, as compared when the first hydrophobic liquid supplying step 95 is performed after the second hydrophobic liquid supplying step 97. The reason therefore seems that the second hydrophobic liquid is less reactive than the first hydrophobic liquid. That is to say, when the second hydrophobic liquid is firstly supplied, it is considered that, since a reactivity of the second hydrophobic liquid with respect to the metal film is weaker, the second hydrophobic liquid adhering to the metal film tends to be easily washed away by the first hydrophobic liquid which is subsequently supplied. On the other hand, when the first hydrophobic liquid is firstly supplied, it is considered that, since a reactivity of the first hydrophobic liquid with respect to the inorganic film is stronger, the first hydrophobic liquid adhering to the inorganic film is difficult to be washed away by the second hydrophobic liquid which is subsequently supplied.

In the above embodiment, there is described the example in which the substrate to be processed W includes the substrate body part $W_i$ which is formed of the inorganic film, and the projecting-shape parts $W_m$ which are formed of the metal film, with the substrate body part $W_i$ formed of the inorganic film and the projecting-shape parts $W_m$ formed of the metal film being laminated to each other (see, FIGS. 3(a) and 3(b)). However, not limited thereto, projecting-shape parts $W_{pi}$ and $W_{pm}$ may be formed by laminating an inorganic film $W_{pi}$ and a metal film $W_{pm}$, for example, (see, FIG. 7). In this case, a surface tension acting between the inorganic films (between a substrate body part $W_{bi}$ and the projecting-shape part $W_{pi}$, and between the projecting-shape parts $W_{pi}$ adjacent to each other) can be reduced by the first hydrophobic liquid, a surface tension acting between the metal films (between the projecting-shape parts $W_{pm}$ adjacent to each other) can be reduced by the second hydrophobic liquid, and a surface tension acting between the inorganic film (the substrate body part $W_{bi}$) and the metal film (the projecting-shape part $W_{pm}$) can be reduced by both the first hydrophobic liquid and the second hydrophobic liquid. Therefore, the force F which would fall down the projecting-shape parts $W_{pi}$ and $W_{pm}$ can be significantly reduced, whereby the projecting-shape parts $W_{pi}$ and $W_{pm}$ can be prevented from falling down.

In the above embodiment, the different film is formed of the metal film. However, not limited thereto, the different film may be formed of an organic film, or the different film may be formed of both an organic film and a metal film.

Figure 8:
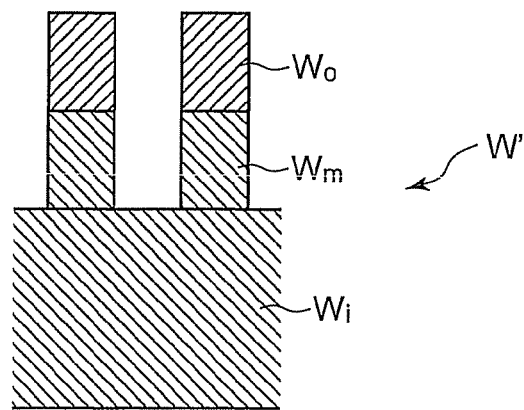
FIG. 8 is a side sectional view showing another alternative example of the substrate to be processed used in one embodiment according to the present invention.

As an example in which the different film is formed of both an organic film and a metal film, there may be raised a substrate to be processed W' including a metal film $W_m$ disposed on a substrate body part $W_i$, and a resist film $W_o$ formed of an organic film disposed on the metal film $W_m$ (see, FIG. 8). Herebelow, there is briefly described an example for processing the substrate to be processed W' including the substrate body part $W_i$ and the different film disposed on the substrate body part $W_i$, the different film being formed of both the resist film $W_o$ formed of the organic film and the metal film $W_m$.

At first, the substrate body part $W_i$ is prepared. Then, the metal film $W_m$ is disposed on the substrate body part $W_i$. Then, the resist film $W_o$ formed of an organic film is disposed on the metal film $W_m$. Then, the resist film $W_o$ of the substrate to be processed W' is exposed to light as a predetermined pattern and is then developed. Then, the metal film $W_m$ which is not protected by the resist film $W_o$ is removed by an etching liquid. Thereafter, the substrate to be processed W' is washed by the rinse liquid (e.g., DIW). At this time, the first hydrophobic liquid supplying step 95 and the second hydrophobic liquid supplying step 97 are performed as described below.

To be more concrete, due to the etching liquid as the chemical liquid which is supplied to the substrate to be processed W', the metal film which is not protected by the resist film $W_o$ is etched (chemical-liquid supplying step 91) (see, FIG. 4), so that projecting-shape parts $W_m$ and $W_o$ are formed. Then, the rinse liquid is supplied to the surface of the substrate to be processed W', such that the projecting-shape parts $W_m$ and $W_o$ of the substrate to be processed W' are not exposed from a liquid surface (rinse-liquid supplying step 92) (see, FIG. 4).

Then, the substitute liquid is supplied to the surface of the substrate to be processed W to which the rinse liquid has been supplied, such that the projecting-shape parts $W_m$ and $W_o$ of the substrate to be processed W' are not exposed from a liquid surface (substitute-liquid supplying step 93a) (see, FIG. 4). Then, the first hydrophobic liquid is supplied to the surface of the substrate to be processed W' to which the substitute liquid has been supplied, such that the projecting-shape parts $W_m$ and $W_o$ of the substrate to be processed W' are not exposed from a liquid surface (first hydrophobic liquid supplying step 95) (see, FIG. 4). At this time, the substrate body part $W_i$ which is formed of the inorganic film is made hydrophobic. Then, the substitute liquid is supplied, such that the projecting-shape parts $W_m$ and $W_o$ of the substrate to be processed W' are not exposed from a liquid surface (substitute-liquid supplying step 93b) (see, FIG. 4). Since the resist film $W_o$ formed of the organic film will be dissolved by IPA which is raised as an example of the amphipathic liquid, the use of IPA as the substitute liquid is not preferred in the embodiment wherein the different film is formed of the organic film. Thus, when the different film is formed of the organic film, HMNDS (hexamethyl disilazane) is preferably used as the substitute liquid.

Then, the rinse liquid is supplied, such that the projecting-shape parts $W_m$ and $W_o$ of the substrate to be processed W' are not exposed from a liquid surface (rinse-liquid supplying step 96a) (see, FIG. 4). Then, the second hydrophobic liquid is supplied to the surface of the substrate to be processed W' to which the rinse liquid has been supplied, such that the projecting-shape parts $W_m$ and $W_o$ of the substrate to be processed W' are not exposed from a liquid surface (second hydrophobic liquid supplying step 97) (see, FIG. 4). At this time, the projecting-shape parts $W_m$ and $W_o$, which are formed of the organic film and the metal film constituting the different film, are made hydrophobic. Then, the rinse liquid is supplied from the rinse-liquid supply part 22, such that the projecting-shape parts $W_m$ and $W_o$ of the substrate to be processed W' are not exposed from a liquid surface (rinse-liquid supplying step 96b) (see, FIG. 4).

Then, the substrate to be processed W' is dried (drying step 99), and thereafter the resist film $W_o$ on the metal film is removed. Thus, there can be obtained the substrate to be processed W' in which the metal film of the predetermined pattern is formed on the substrate body part $W_i$.

As described above, according to this embodiment, even when the substrate to be processed W' in which the different film is formed of both the resist film $W_o$ which is the organic film and the metal film $W_m$, the respective chemical-liquid supplying step 91, the rinse-liquid supplying steps 92, 96a, and 96b, the substitute-liquid supplying steps 93a and 93b, the first hydrophobic liquid supplying step 95, and the second hydrophobic liquid supplying step 97 are performed, without the projecting-shape parts $W_m$ and $W_o$ being exposed from the liquid surface. Thus, action of a surface tension between the projecting-shape parts $W_m$ and $W_o$ can be prevented, before the drying step 99 is performed.

Moreover, the substrate body part $W_i$, which is formed of the inorganic film, is made hydrophobic by the first hydrophobic liquid, and the projecting-shape parts $W_m$ and $W_o$, which are formed of the metal film (different film) or the organic film (different film), are made hydrophobic by the second hydrophobic liquid. Thus, when the substrate to be processed W' is dried, the force F, which would fall down the projecting-shape parts $W_m$ and $W_o$, can be significantly reduced.

Since the resist film $W_o$ is formed of the organic film, the resist film $W_o$ has to exhibit a hydrophobicity under normal circumstances. However, owing to the process by the etching liquid, organic molecules positioned on an outer surface (side surface of the resist film WO are severed. Thus, the organic molecules react and connect with —OH (hydroxyl groups) positioned therearound, so as to exhibit a hydrophilicity. Therefore, when the resist film $W_o$, which has been processed by the etching liquid, is washed by the rinse liquid, there is a possibility that the projecting-shape parts $W_m$ and $W_o$ including the resist film $W_o$ might fall down. However, in this embodiment, since the first hydrophobic liquid supplying step 95 and the second hydrophobic liquid supply step 97 are performed, the resist film $W_o$ can be prevented from falling down.

In the above embodiment, there is described the example in which the second hydrophobic liquid supplying step 97 is performed after the first hydrophobic liquid supplying step 95. However, not limited thereto, the first hydrophobic liquid supplying step 95 may be performed after the second hydrophobic liquid supplying step 97. However, also in a case where the different film has the resist film $W_o$ formed of the organic film, the metal film and the organic film can be more reliably made hydrophobic, i.e., a further excellent effect can be provided, when the second hydrophobic liquid supplying step 97 is performed after the first hydrophobic liquid supplying step 95.

When the second hydrophobic liquid, which is formed of a highly selective surface active agent, is firstly supplied to the substrate to be processed W, there is a possibility that the second hydrophobic liquid might adhere to the inorganic film, which prevents the first hydrophobic liquid from adhering to the inorganic film. Also from this reason, when the second hydrophobic liquid supplying step 97 is performed after the first hydrophobic liquid supplying step 95, the inorganic film can be more reliably made hydrophobic, i.e., a further excellent effect can be provided.

The invention claimed:

1. A liquid processing method configured to process an object to be processed including a body part and a plurality of projecting-shape parts disposed on the body part with an inorganic film and a metal film being laminated to each other, the liquid processing method comprising:

supporting the body part of the object to be processed by a support part;
supplying a first hydrophobic liquid for making hydrophobic the inorganic film to the object to be processed supported by the support part;
supplying a second hydrophobic liquid for making hydrophobic the metal film to the object to be processed supported by the support part; and
supplying a rinse liquid to the object to be processed to which both the first hydrophobic liquid and the second hydrophobic liquid have been supplied.

2. The liquid processing method according to claim 1, wherein the second hydrophobic liquid is supplied to the object to be processed after the first hydrophobic liquid is supplied to the object to be processed.

3. The liquid processing method according to claim 2, further comprising:
supplying a substitute liquid,
wherein the substitute liquid is supplied to the object to be processed,
then, the first hydrophobic liquid is supplied to the object to be processed,
then, the substitute liquid is supplied to the object to be processed,
then, the rinse liquid is supplied to the object to be processed,
then, the second hydrophobic liquid is supplied to the object to be processed,
then, the rinse liquid is supplied to the object to be processed; and
then, rotating the object to be processed so as to dry the object to be processed.

4. The liquid processing method according to claim 1, further comprising:
rotating the object to be processed so as to dry the object to be processed at least after the first hydrophobic liquid, the second hydrophobic liquid, and the rinse liquid are supplied to the object to be processed.

5. The liquid processing method according to claim 4, wherein
the projecting-shape parts of the object to be processed are completely covered by a total of the first hydrophobic liquid, the second hydrophobic liquid, and the rinse liquid at a point in time while the first hydrophobic liquid, the second hydrophobic liquid, and the rinse liquid are supplied to the object to be processed, and
the projecting-shape parts of the object to be processed begin to be exposed from the liquid surface when the object to be processed is rotated so as to dry the object to be processed.

* * * * *